US012224559B2

United States Patent
Bandyopadhyay et al.

(10) Patent No.: US 12,224,559 B2
(45) Date of Patent: *Feb. 11, 2025

(54) LIGHT EMITTING DEVICE WITH DETERMINABLE SHAPE OF OUTPUT BEAM

(71) Applicant: Bandwidth10, LTD., Berkeley, CA (US)

(72) Inventors: Neelanjan Bandyopadhyay, Berkeley, CA (US); Carlos F. R. Mateus, Berkeley, CA (US); Christopher Chase, Berkeley, CA (US); Michael Y. Huang, Berkeley, CA (US); Chuanshun Cao, Berkeley, CA (US); Dalila Ellafi, Berkeley, CA (US); Carl V. Ford, Berkeley, CA (US); Kai Hui, Berkeley, CA (US); Philip Worland, Berkeley, CA (US)

(73) Assignee: Bandwidth10, LTD., Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/107,140

(22) Filed: Feb. 8, 2023

(65) Prior Publication Data

US 2024/0072518 A1 Feb. 29, 2024

Related U.S. Application Data

(60) Provisional application No. 63/432,050, filed on Dec. 12, 2022, provisional application No. 63/415,268, (Continued)

(51) Int. Cl.
*H01S 5/30* (2006.01)
*H01S 5/00* (2006.01)
(Continued)

(52) U.S. Cl.
CPC ........ *H01S 5/3095* (2013.01); *H01S 5/18327* (2013.01); *H01S 5/18358* (2013.01);
(Continued)

(58) Field of Classification Search
CPC .................................................. H01S 5/18327
See application file for complete search history.

(56) References Cited

U.S. PATENT DOCUMENTS

2006/0227835 A1* 10/2006 Ueki ................... H01S 5/18341
372/50.124

* cited by examiner

*Primary Examiner* — Tuan N Nguyen
(74) *Attorney, Agent, or Firm* — Paul Davis

(57) ABSTRACT

A light emitting device has a first mirror; and one or more active regions with a first active region adjacent to the first mirror. Each of active region includes quantum wells and barriers, and is surrounded by one or more p-n junctions. The active regions have a selected shape structure each with a tunnel junction (TJ). One or more apertures are provided with the selected shape structure; one or more buried tunnel junctions (BTJ), additional TJ's, planar structures and/or additional BTJ's, created during a regrowth process that is independent of a first growth process of the first mirror as well as the active region and the one or more TJs. One or more electrical confinement apertures are defined by the one or more BTJ's, additional TJ's, planar structures and/or additional BTJ's. A vertical resonator cavity is disposed over the electrical confinement aperture. A high contrast grating (HCG) operates as a second mirror positioned over the vertical resonator cavity. The HCG is configured to reflect a first portion of light back into the vertical resonator cavity, and a second portion of the light as an output beam from the VCSEL. The HCG structure is layered on the selected shape structure. A shape of the output beam of the light emitting device is determined by a geometric shape of the one or more BTJ apertures, apertures for additional TJ's, planar (Continued)

Deep Proton Implant structures and/or additional BTJ's, with a transmission function of the HCG. The shape is designed according to the desired optical transmission function of the application.

17 Claims, 13 Drawing Sheets

Related U.S. Application Data filed on Oct. 11, 2022, provisional application No. 63/402,560, filed on Aug. 31, 2022, provisional application No. 63/402,556, filed on Aug. 31, 2022, provisional application No. 63/402,546, filed on Aug. 31, 2022, provisional application No. 63/402,553, filed on Aug. 31, 2022.

(51) Int. Cl.
*H01S 5/06* (2006.01)
*H01S 5/183* (2006.01)

(52) U.S. Cl.
CPC ........ *H01S 5/18394* (2013.01); *H01S 5/0071* (2013.01); *H01S 5/0612* (2013.01); *H01S 5/0614* (2013.01)

Buried Tunnel Junction
28 electrical current confinement through 28 BTJ aperture - electrical current flows from top contact to bottom contact (not shown)

MANUFACTURING SEQUENCE

- Growth of bottom VCSEL – see below
- Next:
  - Timed etch of TJ, leaving some p++ – target is 5-10nm
  - Regrowth of top VCSEL from etched seed layer

LIGHT EMITTING DEVICE WITH DETERMINABLE SHAPE OF OUTPUT BEAM

FIELD OF THE INVENTION

This invention relates generally to light emitting devices, and more particularly to light emitting devices where a shape of an output beam is determined by a geometric shape of a buried tunnel junction (BTJ) aperture transmitted through a high contrast grating (HCG) mirror.

BRIEF DESCRIPTION OF THE RELATED ART

VCSELs with tunnel junctions are known. Tunneling in GaAs, at an n+/p+ junction, is well known (see, for example, N. Holonyak, Jr. and I. A. Lesk, Proc. IRE 48, 1405, 1960), and is generally of interest for its negative resistance. Tunneling in GaAs can be enhanced with an InGaAs transition region (see, for example, T. A. Richard. E. I. Chen. A. R. Sugg. G. E. Hofler, and N. Holonyak, Jr., Appl. Phys. Lett. 63, 3613, 1993), and besides its negative resistance behavior, can be used in reverse bias as a form of "ohmic" contact. This allows, for example, the reversal of the doping sequence of an Al sub×Ga sub-1-x as—GaAs quantum well heterostructure laser (n forward arrow pop forward arrow n) grown on an n-type GaAs substrate. See, for example, A. R. Sugg, E. I. Chen, T. A. Richard, S. A. Maranowski, and N. Holonyak, Jr., Appl. Phys. Lett. 62, 2510 (1993) or the cascading of absorbing regions to produce higher efficiency solar cells (see for example D. L. Miller, S. W. Zehr and J. S. Harris Jr, Journ. App. Phys., 53(1), pp 744-748, (1982) and P. Basmaji, M. Guittard, A. Rudra, J. F. Carlin and P. Gibart, Journ. Appl, Phys., 62(5), pp 2103-2106. (1987)).

Use of tunnel junctions in order to increase the optical round-trip gain in the cavity and increase differential efficiency is shown in "Room-temperature, electrically-pumped, multiple-active region VCSELs with high differential efficiency at 1.55 μm", Kim, J. K.; Hall, E.; Sjolund, O.; Coldren, L. A.; Dept. Electr. & Comput. Eng., California Univ., Santa Barbara, Calif., 1999 IEEE LEOS Annual Meeting Conference Proceedings, 12$^{th}$ Annual Meeting San Francisco, Calif., 8-11 Nov. 1999 and in "CW room temperature operation of a diode cascade quantum well VCSEL" Knodl, T.; Jager, R.; Grabherr, M.; King, R.; Kicherer, M.; Miller, M.; Mederer, F.; Ebeling, K. J.; Dept. of Optoelectron., Ulm Univ., Germany, 1999 IEEE LEOS Annual Meeting Conference Proceedings, 12$^{th}$ Annual Meeting San Francisco. Calif., 8-1 Nov. 1999. The concept has also been demonstrated in edge emitting laser where several active layers have been stacked to produce high power lasers (see for example J. C. Garcia, E. Rosencher, P. Collot, N. Laurent, J. L. Guyaux, E. Chirlias and J. Nagle, PT1. 15, Xth international MBE conference on Molecular Beam Epitaxy, Cannes (France), 1998; U.S. Pat. No. 5,212, 706, Issued May 18, 1993, "Laser diode assembly with tunnel junctions and providing multiple beams", J. Faquir, C. Storrs.

A tunnel contact junction can be used in a light emitting semiconductor device as a hole source and makes possible lateral bias currents (electron current) to drive a quantum well heterostructure (QWH) laser without the compromise of the low mobility and large resistive voltage drop of lateral conduction in thin p-type layers. This is particularly valuable in QWH laser structures employing upper and/or lower native oxide confining layers (see, for example, M. Dallesasse, N. Holonvak Jr., A. R. Sugg, T. A. Richard, and N. El Zein, Appl. Phys. Lett 57 2844, 1990; A. R. Sugg. E. I. Chen, T. A. Richard, N. Holonyak. Jr., and K. C. Hsieh. Appl. Phys. Lett. 62, 1259, 1993; U.S. Pat. No. 5,936,266, N. Holonyak, J. J. Wierer, P. W. Evans) that require lateral bias currents (see, for example, P. W. Evans, N. Holonyak, Jr., S. A. Maranowski, M. J. Ries, and E. I. Chen, Appl. Phys. Lett. 67, 3168, 1995), or in devices such as a vertical cavity surface emitting laser (VCSEL) where lateral hole currents have been employed (see, for example, D. L. Huffker, D. G. Deppe, and K. Kumar. Appl. Phys. Lett. 65, 97, 1994). Hole conduction along a layer introduces a large device series resistance, because of the low hole mobility, and increases threshold voltages and device heating. A tunnel contact junction on the p side of an oxide confined QWIH can be used to replace lateral hole excitation currents. The hole injection is supported by a lateral electron current, thus providing lower voltage drop and less series resistance. This minimizes the amount of p-type material and, to the extent possible, employ only n-type layers (electron conduction) to carry the device current. In addition to electrical and thermal performance advantages from reducing the amount of lossier p-type material, an optical advantage can also accrue since p-type material of the same conductance as n-type material is generally more absorptive of the light being generated in semiconductor light emitting devices (see for example J. Boucart, C. Starck, F. Gaborit, A. Plais, N. Bouche. E. Derouin, L. Goldstein. C. Fortin. D. Carpentier. P. Salet, F. Brillouet, and J. Jacquet, Photon Tech. Lett., 11(6), June 1999 and Patent EP00869593A, F. Brillouet, P. Salet, L. Goldstein, P. Garabedian, C. Starck, J. Boucart/JP10321952A).

A transmission of laser signal in fiber over longer distances require laser to oscillate at longer wavelengths, where optical fibers have much lower absorption, or around 1550 nm or 1310 nm. VCSELs manufactured at longer wavelengths require a material with smaller band gap. InP is used as seed wafer and epitaxial layers of ternary or quaternary AlGaInPAs are deposited according to VCSEL design.

A more recent approach for current confinement uses the concept of buried tunnel junction. This approach requires mesa etching of a tunnel junction and subsequent regrowth of epitaxial layers. Regrowth creates a p-n junction which is reversed biased during normal operation of laser. The unetched aperture region preserves the tunnel junction and creates a low resistance path for electrical current confinement. The advantage of this approach with respect to ion implantation is a better electrical blocking around the aperture.

If the technology for current confinement can be further developed in order to be made compatible with a direct tuning mechanism, this laser can be extremely advantageous for several reasons and applications. One single laser can be used as a backup in systems which employ several different wavelengths in the same optical fiber. These tunable lasers can also be used as spare parts for any multiwavelength system, then allowing for a drastic reduction of cost of parts in stock. Direct tunability is also extensively used on gas sensors, fiber optic sensors and optical coherence tomography systems, just to cite a few other applications different than communications.

There is a need for an improved VCSEL, which can operate at high speeds, notably above 1300 nm where optical fibers are much less lossy. There is a further need for a VCSEL with single mode operation and Gaussian beam output. There is yet another need for a VCSEL that is tunable.

SUMMARY

An object of the present invention is to provide an improved VCSEL.

Another object of the present invention is to provide a tunable VCSEL with single mode operation and designable Gaussian beam output, which can be used to optimize the beam for high coupling efficiency or whatever characteristics are desirable for the end application.

A further object of the present invention is to provide a VCSEL with a selected shape structure that is chosen relative to an application, a high contrast grating (HCG) structure layered on the selected shape structure, with the VCSEL being tunable.

These and other objects of the present invention are achieved in a light emitting device with a first mirror; and one or more active regions with a first active region adjacent to the first mirror. Each of active region includes quantum wells and barriers, and is surrounded by one or more p-n junctions. The active regions have a selected shape structure each with a tunnel junction (TJ). One or more apertures are provided with the selected shape structure; one or more buried tunnel junctions (BTJ), additional TJ's, planar structures and/or additional BTJ's, created during a regrowth process that is independent of a first growth process of the first mirror as well as the active region and the one or more TJs.

One or more electrical confinement apertures are defined by the one or more BTJ's, additional TJ's, planar structures and/or additional BTJ's. A vertical resonator cavity is disposed over the electrical confinement aperture. A high contrast grating (HCG) operates as a second mirror positioned over the vertical resonator cavity. The HCG is configured to reflect a first portion of light back into the vertical resonator cavity, and a second portion of the light as an output beam from the VCSEL. The HCG structure is layered on the selected shape structure. A shape of the output beam of the light emitting device is determined by a geometric shape of the one or more BTJ apertures, apertures for additional TJ's, planar structures and/or additional BTJ's, with a transmission function of the HCG. The shape is designed according to the desired optical transmission function of the application.

DETAILED DESCRIPTION

Figure 1A:
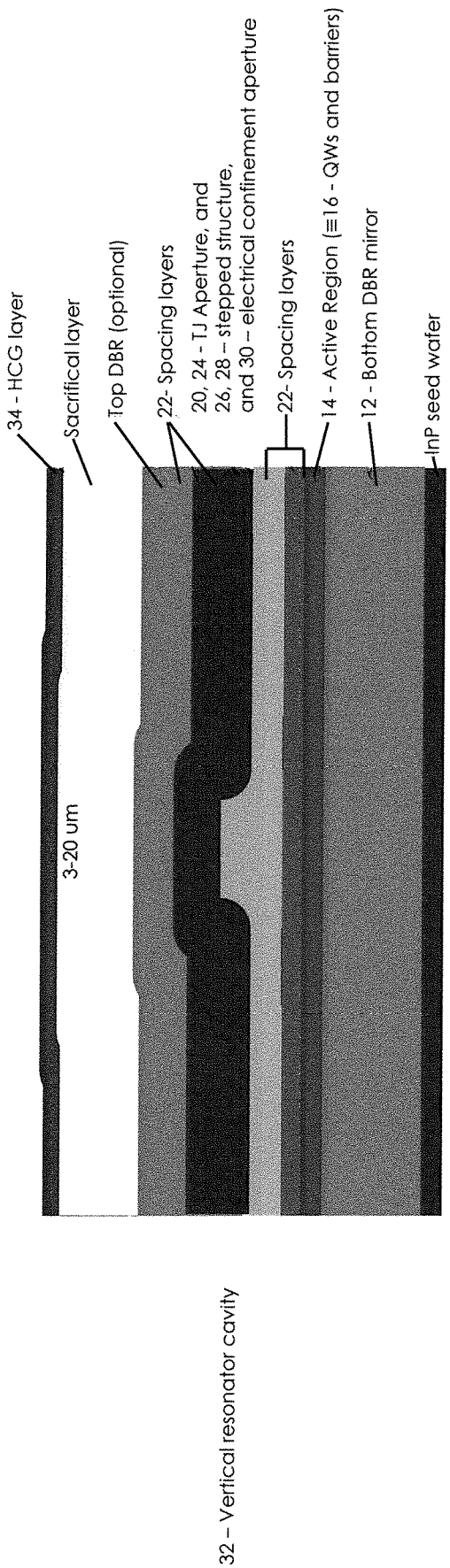
FIG. 1(a) illustrates one embodiment of a light emitting device of the present invention with a seed layer and HCG layer.
Figure 1B:
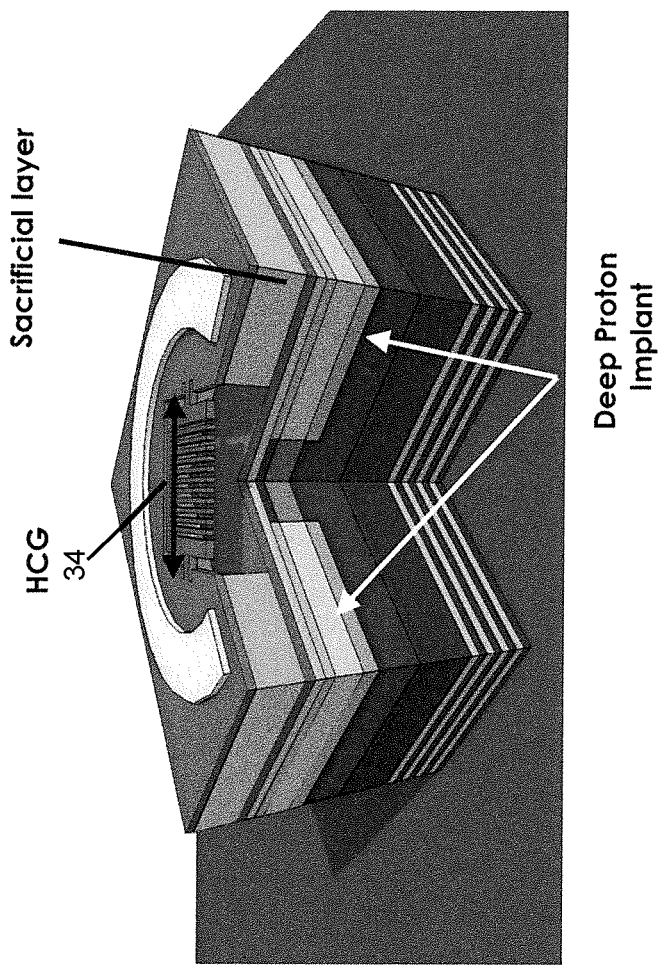
FIG. 1(b) illustrates an embodiment of FIG. 1(a) with a sacrificial layer and deep proton implant.
Figure 1C:
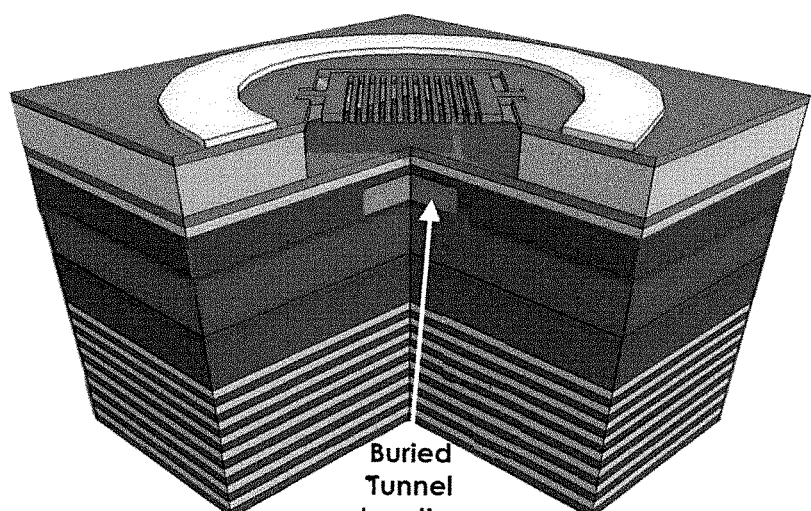
FIG. 1 (c) illustrates the FIG. 1(b) embodiment with the deep proton implant but with a buried tunnel junction.
FIG. 1(d) illustrates one embodiment of a light emitting device of the present invention with multiple-junction HCG tunability.
Figure 1D:
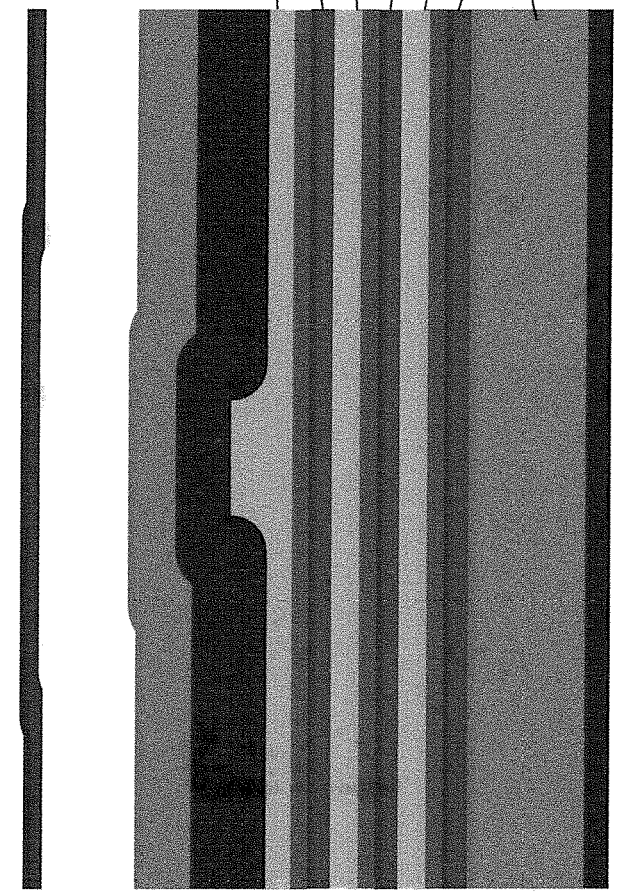
Figure 2:
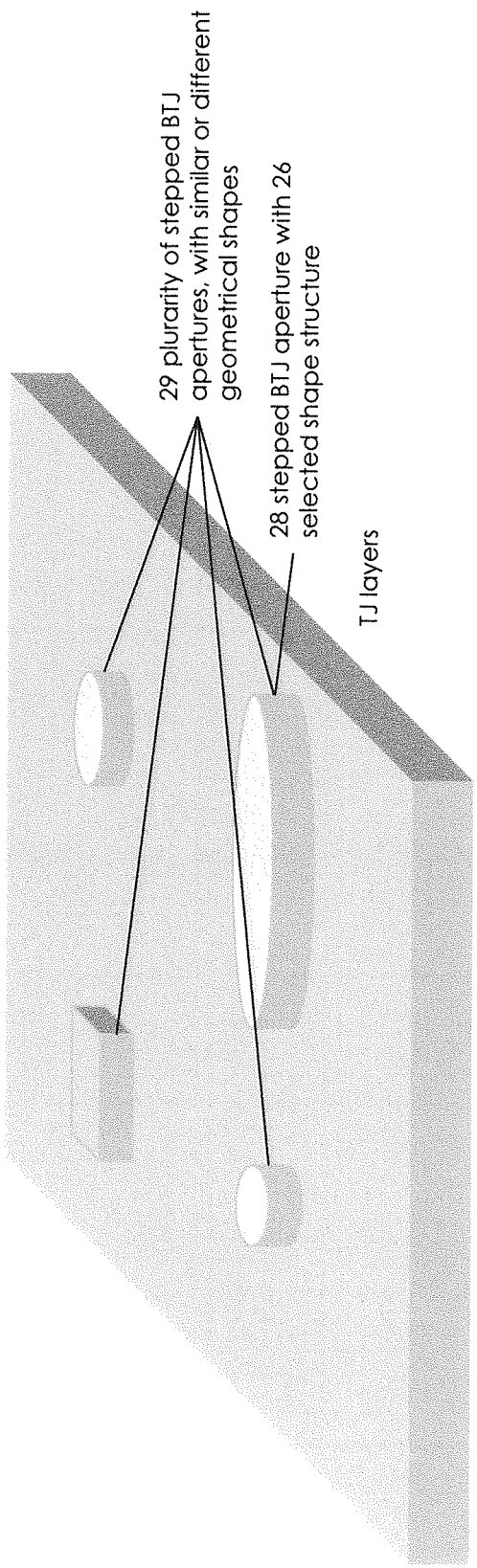
FIG. 2 illustrates an embodiment with several stepped BTJ apertures with different geometric shapes.
Figure 3:
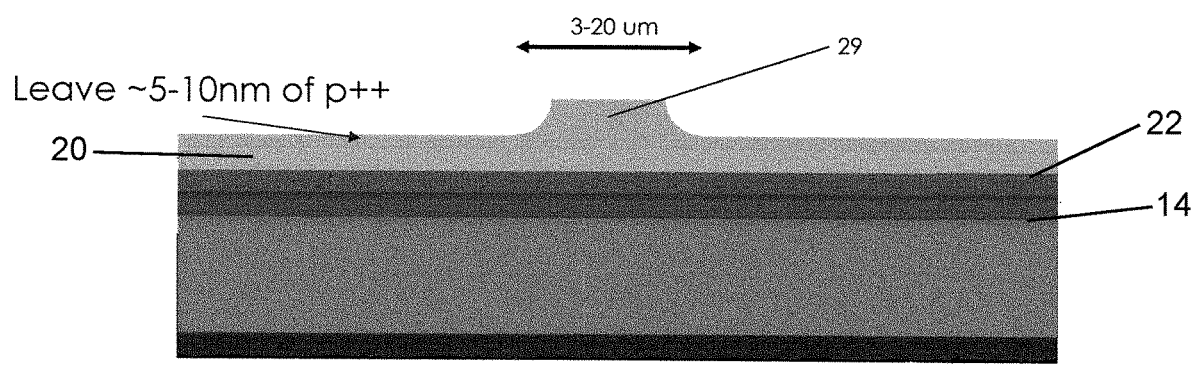
FIG. 3 illustrates a shaped structure, which can be a plateau, of the present invention.

In one embodiment, illustrated in FIGS. 1(a)-1(d), a light emitting device 10 includes: a first mirror 12 ("DBR"), which can be a bottom mirror, and one or more active regions 14. A first active region 14 is adjacent to the first mirror 12. The one or more active regions 14 are stacked in the light emitting device 10 to provide for a selected shape structure 26 with an active region that includes a tunnel junction (TJ) 20, another active region 14, another TJ 20 and so on, as illustrated in FIG. 2 There can be a repetition of active regions 14 and TJ's 20, providing a plurality of successive active regions 14 with TJ's 20, as illustrated in FIG. 2. Each active region 14 includes quantum wells and barriers 16 surrounded by one or more p-n junctions 18, see FIG. 3. As previously recited, one or more TJ's 20 are provided. Each of an aperture 24 is provided with a selected shaped structure 26, illustrated in FIG. 4. As non-limiting examples, the selected shape structure 26 can be open or closed, geometric or non-geometric shape, and the like. The shape of the selected shape structure 26 is based on a desired optical transmission function for a desired application, as shown in FIG. 4

Figure 4:
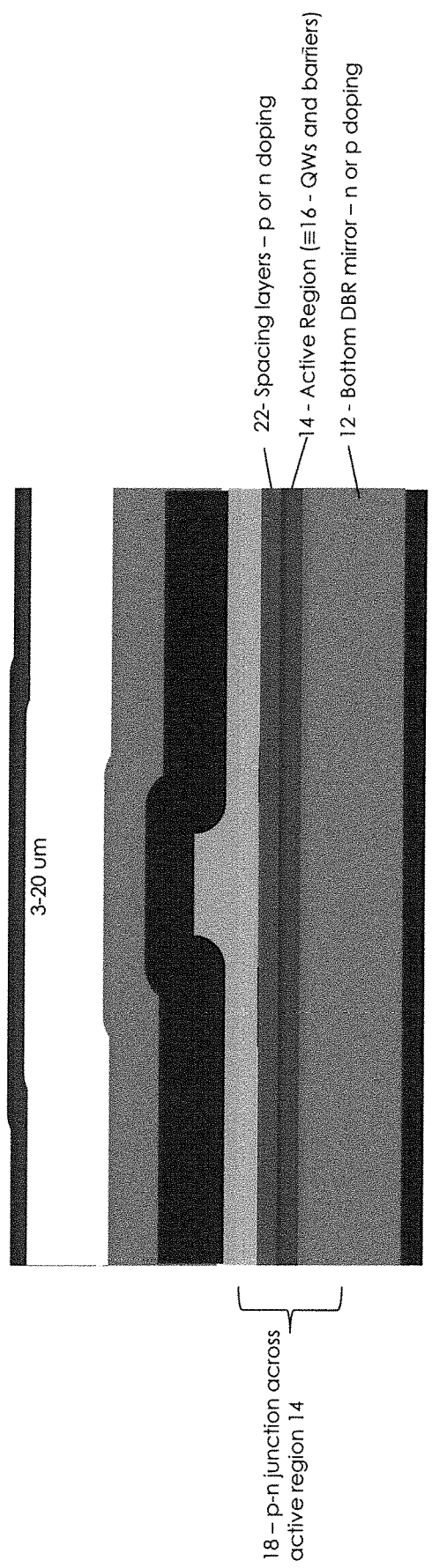
FIG. 4 illustrates one embodiment of a P-N junction.

In one embodiment, the selected shape structure 26 is a stepped structure, see FIG. 4. The degree of the stepping can be at a variety of different angles, as determined by the etching process. The selected shape structure 26 can be substantially any geometry, including but not limited to a four corned star, circular, square and the like. As a non-limiting example, the selected shape structure 26 can be created using an inverse design. The selected shape structure 26 is selected in order to create an optimal desired far field pattern depending on the desired application. As a non-limiting example, the selected shape structure 26 is formed by etching.

In one embodiment, a first growth is used to create the bottom mirror 12, TJs 20, active regions 14, and the like. In one embodiment, a selected geometric configuration buried tunnel junction 28 is created during a regrowth process. The light emitting device 10 is created by the first growth, followed by a second or regrowth of the first growth. The first growth creates a planar structure. Additional BTJ's 28 00000000000000000000000000000000 are created from second, third and the like regrowth's. The creation of multiple BTJ's is formed during multiple regrowth processes. All of these regrowth's are independent of the first growth process.

An area 30 is defined by the one or more BTJ's 28, additional TJ's 20, planar structures and/or addition BTJ's 28. A vertical resonator cavity 32 is defined by a second mirror over the electrical confinement aperture 30, see FIG. 6 A high contract grating (HCG) 34 operates as a second mirror positioned at the top of the vertical resonator cavity 32.

Figure 5:
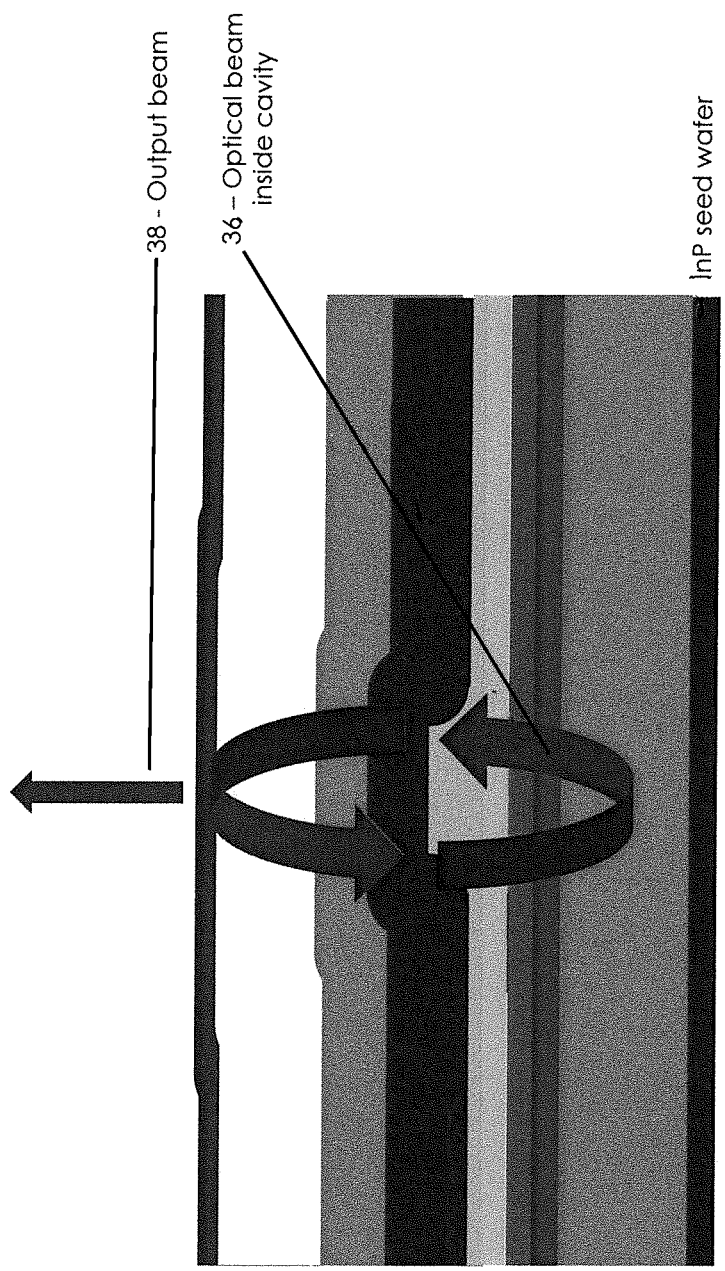
FIG. 5 illustrates an embodiment of FIG. 1(a) with an output beam and an optical beam inside of a cavity.
Figure 6:
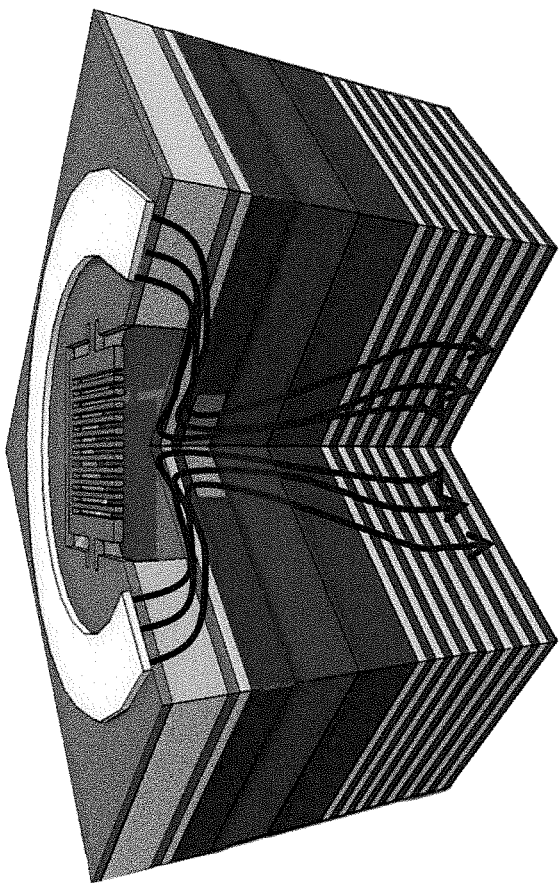
FIG. 6 illustrates one embodiment of electrical current confinement through a BTJ aperture, where electrical current flow from a top to a bottom contact.

In one embodiment, the HCG 34 conformally covers the selected shape structure 26 layered on the selected shape structure 26. The HCG 34 remains anchored by a variety of different methods including not limited to: a membrane, or membrane structure, by beams after partial removal of sacrificial layer in order to move with respect to the optical resonator and modify a cavity length and consequent wavelength emitted by light emitting structure, and the like. A shape of the output beam 38, as in FIGS. 5 and 6, is determined by a geometric shape of the one or more BTJ apertures 29, and the apertures for additional TJ's 20, planar structures and/or additional BTJ's 28. and a transmission function of the HCG 34. HCG 34 is designed according to a desired optical transmission function for a desired application.

As a non-limiting example, the HCG 34 operates as a second mirror positioned over the vertical resonator cavity 32. As a non-limiting example, the HCG 34 is layered on a substrate 40. In one embodiment, a shape of the output beam of light emitting device 10 is determined by a geometric shape of the one or more BTJ apertures 29, and apertures for additional TJ's 20, planar structures and/or additional BTJ's 28.

As a non-limiting example, the far field transmission range is application dependent. As a non-limiting example, the output beam can be a plurality of different geometries including but not limited to circular, elliptical and the like.

The selected shape structure can be created by a variety of ways. As non-limiting examples, the selected shape structure can be created can be made with a grid, a circular array of dots, a screen, hole and screens, and the like.

In one embodiment, the light emitting device 10 is a VCSEL (hereafter referred to as ("VCSEL 10").

Relative to efficiency, the VCSEL 10 can be designed to maximize the light output relative to the desired application. Additionally, the number of BTJ's 28 created can be in response to the application.

In one embodiment, a shape of the output beam 38 is configured from a design of the electrical confinement aperture 30. As a non-limiting example, a geometry of the electrical confinement aperture 30 is slightly asymmetric to provide that the beam 36 inside the VCSEL 10 provides a Gaussian beam shape as the output beam 38 from the HCG 34.

In one embodiment, a coupling loss of the output beam 38 to a fiber or wavelength is reduced when VCSEL output beam 38 is designed to match the fiber modes. As a non-limiting example, the HCG 34 controls one or more of: an output beam 38 polarization, optical beam 3 shape and a single longitudinal wavelength. As a non-limiting example, the HCG 34 is further released from selected shape structure 26 by selective etch of spacing layers 22. In one embodiment, p-doping is on a top of the active region 14 leading to n-doping to a bottom of active region 14.

In one embodiment, at least a portion of the spacing layers 22 above the one or more BTJ apertures 29, the apertures for additional TJ's 20, planar structures and/or addition BTJ's 28, have thicknesses defined as multiples of quarter-wavelength of target lasing wavelength, in one embodiment, spacing layers and the top DBR 42 can have different thickness. As a non-limiting example, the top DBR 42 has a smaller number of layers than the bottom DBR.

Spacing layers 22 can also be used for electrical current spreading, thermal dissipation, or minimizing optical absorption, for example, but not limited to those ends.

In one embodiment, a top DBR 42 is not included in VCSEL 10. The sacrificial layer 44 of semiconductor material is removed via etching at specific locations in order to release the top mirror tuning structure. In one embodiment, the etching of the sacrificial layer 44 uses a wet or dry etch process. The sacrificial layer 44 can remain when the top mirror is not moveable as a non-tunable design and has a low index of refraction compared to a material of the top DBR 42. Successive steps are used in the growth of the VCSEL 10 and can also provide lateral optical confinement due to a graded lens effect. An epitaxial growth and a regrowth of the VCSEL 10 is achieved In one embodiment, HCG 34 is formed of a semiconductor epitaxial layer. HCG 34 is layered on a selected shape structure 26, that can be less than 100 nm. In one embodiment, VCSEL 10 produces a stable linearly polarized output defined by HCG 34. In one embodiment of the present invention, VCSEL 10 is created by a process of two independent epitaxial growths. In one embodiment, first and second epitaxial growth structures are characterized, and formed by epitaxial growth.

As a non-limiting example, the first epitaxial growth structure is on a seed substrate 46 of III-V semiconductor material and includes: the bottom mirror Distributed Bragg Reflector (DBR) 26 on a top surface of the seed substrate 46 is defined by alternate layers of high and low index of refraction. Active region, generally denoted as 24, is adjacent to first mirror 12, consisting of quantum wells and barriers 16. A plurality of layers 22 can be optional. The final layer, and the at least one TJ 20, are etched laterally to define an etched electrical confinement aperture 30 through which an electrical current flow. The HCG 34 and spacing layers 22 are formed over in a stepped format (selected shape structure 26). The etched electrical confinement aperture 30 being the one or more BTJs 28 that is a selected shape structure 26, as a result of further regrowth.

As a non-limiting example, the one or more BTJS 28 provide for VCSEL 10 current confinement in a VCSEL 10, and can be implemented for any VCSEL 10 in the SWIR band, from 650 to 1800 nm. More particularly, this can for InP based VCSELs 10 (above 1300 nm).

In one embodiment, for current confinement, the VCSEL 10 of the present invention uses the one or more BTJ's 28, additional TJ's 20, planar structures and/or addition BTJ's 2, instead of ion implant or oxide aperture.

As a non-limiting example, the VCSEL 10 with the one or more BTJ's 28, a BTJ 28 and can provide better current blocking outside of electrical confinement aperture 30 than ion implanted apertures and also provide good reliability.

In one embodiment, of the first epitaxial growth structure, the top surface of the seed substrate is defined by alternate layers of high and low index of refraction.

In one embodiment, of the first epitaxial growth structure, the active region 14 is a source of light via an electrooptic effect due to a recombination of holes and electron. As a non-limiting example, the active region 14 is undoped and surrounded by one or more p-n junctions in order to promote recombination of electrons-holes.

In one embodiment, of the first epitaxial growth structure, at least a portion of the plurality of spacing layers 22 have a varied thicknesses depending on an optical design. In one embodiment, at least a portion of the plurality of spacing layers 22 are adjacent to the active region 14 or to additional spacing layers 22.

In one embodiment of the first epitaxial growth structure, the TJ 20 is a highly doped p++ layer directly on the top of a highly doped n++ layer.

In one embodiment of the first epitaxial growth structure, final layer is made of a same material of the seed substrate 46.

In one embodiment of the first epitaxial growth structure, the final layer is not included, depending on the optical design.

The TJ 20 layer is etched laterally and defines the selected shape structure 26, that is chosen based on the application. This becomes the one or more BTJs 28, a BTJ 28 additional TJ's 20, planar structures and/or addition BTJ's 28.

In one embodiment, a second epitaxial growth structure starts on a top of the first epitaxial growth structure after TJ 20 lateral etch. In one embodiment, the second epitaxial growth structure is a regrowth on top of the first stepped epitaxial growth structure, creating the one or more BTJs 28 from the one or more TJs 20, This becomes the one or more BTJs 28, additional TJ's 20, planar structures and/or addition BTJ's 28.

In one embodiment, the second epitaxial growth structure includes: spacing layers 22; an optional top DBR 42 mirror; a sacrificial layer; a top layer, which supports the top mirror manufacturing; and extra layers for supporting metal contacts.

In one embodiment, the p-doping is on a top of the active region 14 leading to n-doping to the bottom of the active region 14. In one embodiment, this is reversed and the n-doping is on the top of the active region 14, the p-doping is on the bottom.

In one embodiment of the second epitaxial growth structure, the second epitaxial growth structure starts on a top of the previously processed semiconductor stack.

In one embodiment of the second epitaxial growth structure, the second epitaxial growth structure includes spacing layers 22. As a non-limiting example, these spacing layers 22 have a varied thickness depending on the optical design.

In one embodiment of the second epitaxial growth structure, the spacing layers 22 are above the etched TJ 20 aperture. In one embodiment, the etch of the TJ 20 can be etching into the layers below the TJ 20. The TJ 20 and the layers below it can be fully etched, partially etched and the like. As a non-limiting example, the profile of the etch can be based of the selected application, and sidewalls can be created with sidewall angles of 20 to 90 degrees. the sidewalls of the etch can be created based on etching recipe, RF power, the type of chemicals used, crystal dependence, as well the desired end application. In one embodiment of the second epitaxial growth structure, they are added to complete a multiple of quarter-wavelength of a target lasing wavelength. In one embodiment, they have different thickness. In one embodiment, the spacing layers 22 are also used for electrical current spreading, thermal dissipation, or minimizing an optical absorption, and the like.

In one embodiment of the second epitaxial growth structure, the second epitaxial growth structure has a top DBR 42 mirror on top of a seed substrate, defined by alternating layers of high and low index of refraction of semiconductor. This top DBR 42 is not mandatory and, as a non-limiting example, has a much smaller number of layers when compared to bottom DBR 26, if it is included in the stack, and optimized based on the application, as well as two beam parameters. In one embodiment, the two beam parameters are reflectivity and the wavelength bandwidth of the mirror.

In one embodiment of the second epitaxial growth structure, the second epitaxial growth structure can be application specific, and include specific spacing sacrificial layer of semiconductor material under top mirror. This can be removed via etching at specific locations in order to release the top mirror tuning structure. In various embodiments, the etching of the sacrificial layer can be achieved with a wet or dry etch process. In one embodiment, this layer can alternatively remain in the structure if the top mirror is not supposed to move (non-tunable design) and has a low index of refraction compared to the top mirror material. In one embodiment, the index of refraction is application and can be as large as possible.

In one embodiment of the second epitaxial growth structure, the top mirror layer is processed during a post regrowth using an etching process and becomes a periodic structure designed to resonate and work as a mirror at specific wavelengths.

In one embodiment, the periodic structure is a high contrast metastructure (HCM) or high contrast grating HCG 34, known as subwavelength grating, or a photonic crystal structure. In one embodiment, the mirror effect requires a lower or a same index of refraction around the periodic structure, which can be air, if released, or other semiconductor or dielectric material, if not released. When it is a tunable structure, the periodic structure is actuated in order to change the optical length of optical cavity via an external input that causes movement of the periodic structure. In one embodiment, an external input is based on thermal, electrostatic or piezoelectric excitation. In one embodiment of the tunable design, tunability can also be achieved by heating the VCSEL 10 or changing its driving current.

In one embodiment of the second epitaxial growth structure, the second epitaxial growth structure extra layers are provided that are designed for supporting metal contacts.

In various embodiment, VCSEL 10 is at least one of: an air-cavity-dominant (ACD) or a semiconductor-cavity-dominant (SCD) design. In one embodiment, the regrowth process is configured to be nearly conformal and increase the lateral dimension of initial BTJ step as defined by the electrical confinement aperture 30 during deposition of epitaxial layers in the second epitaxial regrowth, in one embodiment, the regrowth process decreases a height of this step as more and more layers are added. In one embodiment, at the end, the periodic structure for the first mirror 12 is defined on a selected shape structure 26, which, however, does not have to be necessarily a plane.

As non-limiting examples, the successive steps can provide for lateral optical confinement due to a graded lens effect and improve overall efficiency of VCSEL 10.

In one embodiment, the epitaxial growth and regrowth of the VCSEL 10 can be achieved by conventional III-V epitaxy, such as molecular beam epitaxy (MBE) or metallo-organic chemical vapor deposition (MOCVD) or other techniques including but not limited to LPE, SPE and the like. While MBE can provide better control of each atomic layer, MOCVD can provide a better step coverage.

The HCG 34 can provide strong polarization control since the grating, HCG 34, acts as a polarizer, i.e., only stable linear polarization is transmitted through the grating, HCG 34, In one embodiment, the non-planar structure is formed due to the regrowth process which is started on selected shape structure 26 with TJ 20 delimited by a top of a selected geometric structure, including but not limited to a mesa.

In one embodiment, the one or more BTJ apertures 29 that are created during one or more regrowth's. After regrowth, etched TJ 29 becomes BTJ 20, a buried TJ.

In one embodiment, the HCG 34 is configured to reflect a first portion of light 36 back into the vertical resonator cavity 32. A second portion of light 38 is transmitted as an output beam from the light emitting structure 10. As a non-limiting example, every time the first portion of light 36 is reflected into the vertical resonator cavity 32, portions of light, constituting the second portion of light 38, come out of the light emitting structure 10. As a non-limiting example, the first portion of light 36 bounces around the vertical resonator cavity 36, with a portion coming out as the second portion of light 38.

As a non-limiting example, after sufficient thick regrowth, selected shape structure 26 can become planar, a plane plateau, and the like. It can easier to control processing of the periodic structure. In one embodiment, HCG 34 can be manufactured on a curved of stepwise layer, as far as continuous. In one embodiment, a final dimension of the plane plateau is originated from the epitaxial growth on top of electrical confinement aperture 30 and depends on a thickness of intermediary layers and growth conditions. As a non-limiting example, this thickness can be in the range of 10 um to 20 um for a starting electrical confinement aperture 30 with a 3-um diameter.

Figure 7:
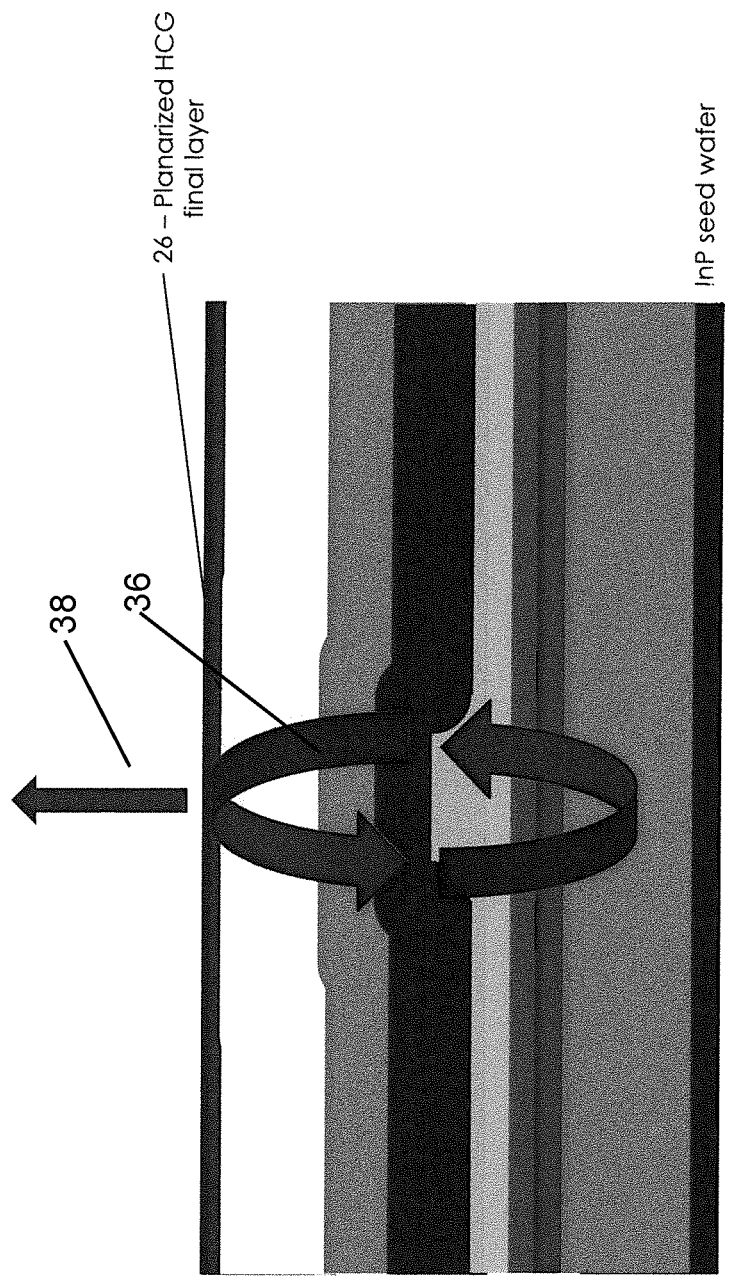
FIG. 7 is similar to FIG. 3, but with a planarized HCG final layer.
Figure 8:
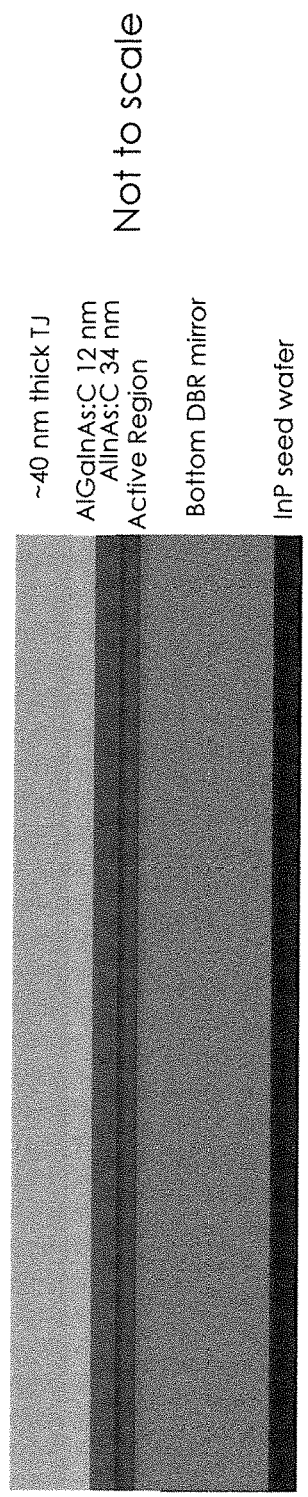
FIG. 8 illustrates one embodiment of a manufacturing sequence with a growth of a bottom, a timed etch of the TJ, leaving some p++, and a regrowth on top of a VCSEL from an etched seed layer.
Figure 9:
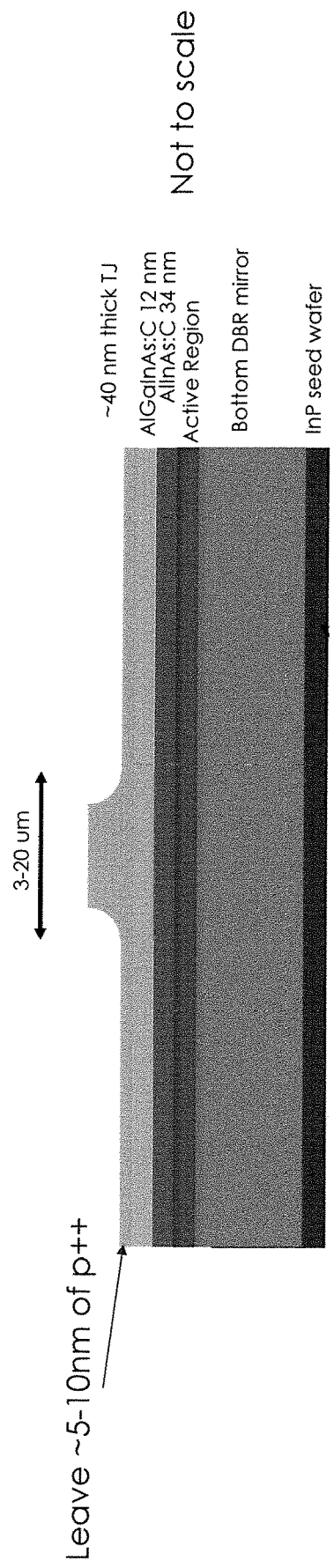
FIG. 9 illustrates one embodiment of a manufacturing sequence with a timed slow etch.
Figure 10:
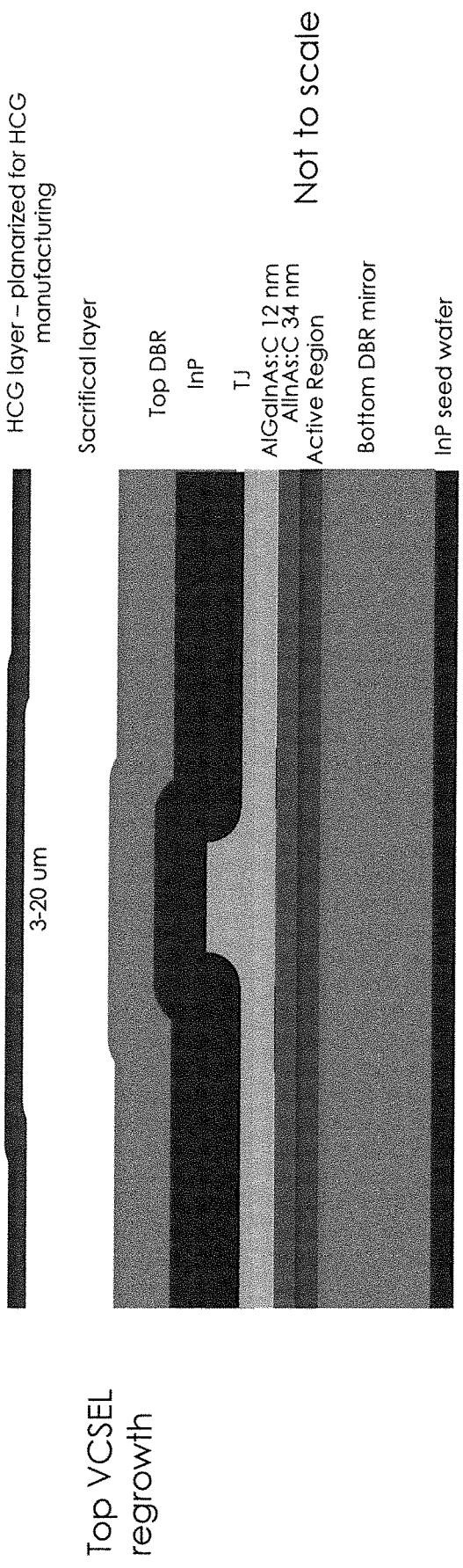
FIG. 10 illustrates one embodiment of a manufacturing sequence with a Regrowth of n-InP with grading, and a regrowth of a top DBR, sacrificial layer and HCG layer.

FIGS. 6-8 illustrate embodiments for the manufacture of VCSEL 10.

In one embodiment, VCSEL 10 is integrated in line detector behind it for FMCW applications, where the reflected light reflects into the VCSEL, causing optical feedback. The detector behind the VCSEL detects power oscillations due to the feedback and the signal can be used to reconstruct the 3D environment.

In one embodiment, a photodetector is at a side of an air gap in s tuning cavity as a detector. As a non-limiting example, the semiconductor, to the side of the air gap in the tunable structure, act as the photodetector and collect scattered light from the HCG and VCSEL body interface due to non-idealities. This offers some advantage to the application in 1) because the photodetector is outside of the cavity and does not contribute any additional feedback, simplifying the signal processing.

Applications

Communications

In one embodiment, VCSEL 10 is used as the light emitting element for a communication system. VCSEL 10 with BTJ aperture 29 has more reliable performance than oxide aperture ones and can be modulated at very higher rates than implanted VCSELs.

In one embodiment, an optoelectronic module includes one or more VCSEL 10 transmitters and/or photodetectors aligned and aligned along a common central longitudinal axis. Light of different wavelengths may be received and transmitted by a single optical fiber or optoelectronic module optically coupled to a free space link. The optoelectronic module can receive two wavelengths and transmit one wavelength, or transmit two wavelengths, in an optical link. The VCSEL 10 transmitter can be electrically pumped by an electrical current source or optically pumped by another laser, such as a vertically integrated pumping VCSEL 10. Parallel optical links support transmission and reception for each duplex channel on a single optical fiber. The parallel optical link comprises an array of optical fibers and an optoelectronic module optically coupled to the array of optical fibers for transmitting a laser signal having a first wavelength and receiving a laser signal having a second wavelength. A first array; and a second array of optoelectronic modules optically coupled to the fiber optic array for transmitting the second wavelength laser signal and receiving the first wavelength laser signal. A multi-channel data distribution system allows for bi-directional data distribution between a central distribution point and a plurality of nodes optically linked to the central distribution point.

In one embodiment, VCSEL 10 is tunable and can perform as sole source for several different wavelength channels;

In one embodiment, VCSEL 10 is tunable and can perform as dedicated source for any of the wavelength channels;

In one embodiment, VCSEL 10 is used as source for a polarization preserving optoelectronic module. VCSEL 10 has stable linear polarization state at output, as defined by HCG 34 design.

In one embodiment, polarization preserving optoelectronic module is used as source for coherent communication links. Polarization state of optical source is also used to carry information and can make the system more spectral efficient than direct detection.

In one embodiment, VCSEL 10 source is tunable and can perform as sole source for several different coherent wavelength channels;

In one embodiment, VCSEL 10 is tunable and can perform as dedicated source for any of the coherent wavelength channels;

Optical Coherence Tomography (OCT)

An OCT system is a non-invasive imaging test. OCT can provide real-time, 1D depth, 2D cross-sectional, and 3D volumetric images with micron-level resolution (~um) and millimeters of imaging depth (~mm). In one of its applications, OCT uses light waves to obtain cross-section images of a retina or other leaving tissue not directly accessible, such as behind eardrums or precancerous lesions in internal organs. It can detect problems in the eyes before any symptoms being within a patient.

OCT is a technique for obtaining sub-surface images of translucent or opaque materials at a resolution equivalent to a low-power microscope. It is effectively 'optical ultrasound', imaging reflections from within tissue to provide cross-sectional images.

OCT has attracted interest among the medical community because it provides tissue morphology imagery at much higher resolution (less than 10 μm axially and less than 20 μm laterally) than other imaging modalities such as MRI or ultrasound.

The key benefits of OCT are: live sub-surface images at near-microscopic resolution; instant, direct imaging of tissue morphology; no preparation of the sample or subject, no contact; and no ionizing radiation.

OCT delivers high resolution because it is based on light, rather than sound or radio frequency. An optical beam is directed at the tissue, and a small portion of this light that reflects from sub-surface features is collected. Note that most light is not reflected but, rather, scatters off at large angles. In conventional imaging, this diffusely scattered light contributes background that obscures an image. However, in OCT a technique called interferometry is used to record the optical path length of received photons allowing rejection of most photons that scatter multiple times before detection. OCT can build up clear 3D images of thick samples by rejecting background signal while collecting light directly reflected from surfaces of interest. OCT technique, on its most usual configuration, uses low coherent light sources for precise determination of tissue based on low coherence interferometry. Infrared wavelengths are the choice for penetration on tissue.

VCSEL 10 under continuous tuning can be modeled as a low coherent source that emits sequential pulses at different wavelengths. Each pulse has temporal coherence inversely proportional to its linewidth, or high coherence, while two successive pulses separated in spectrum for more than their linewidths have low coherence with respect to each other.

Continuously tuned optical sources are used in OCT and the apparatus is known as swept-source OCT Tunable VCSEL 10 can be included in an OCT as the swept light source.

VCSEL 10 is made more reliable than VCSELs with oxide aperture (current state of art for OCT applications) and its optical beam can be shaped for matching the OCT apparatus, either full fiber or free space optics. HCG 34 is made very thin and can achieve very high rates of tuning, increasing resolution of OCT system when compared to other MEMS approaches.

As a non-limiting example, the optical setup can include an interferometer

Medical Application, Tissue Imaging

In one embodiment, VCSEL 10 is used to acquire information on sections of an object with high accuracy even if the area to be imaged with a single scan is wide. A scanning unit is configured such that an angle of linear scanning of a fundus with illuminating light is 47 degrees or greater in the air. A light-source unit 10 includes a MEMS-VCSEL 10 whose coherence length during the sweeping of the frequency of the light is 14 or longer.

In one embodiment, VCSEL 10 is used as light source for laser speckle contrast imaging (LSCI). The random interference pattern produced when coherent light scatters from tissue can be optimized if the source in use is tunable. Moreover, symmetric optical beam shape is essential for quantifying local spatial variance and VCSEL 10 can design beam shape according to the apparatus in use. The more accurate local spatial variance can be determined, the more accurate is the system for identifying particles in motion. In this sense, VCSEL 10 is an ideal source for functional brain imaging.

In one embodiment, VCSEL 10 is used as source for transillumination system used on morpho-functional imaging. Since VCSEL 10 is suitable for array manufacturing, a uniform source of independent coherent emitters can be manufactured in order to illuminate living tissue from its back side (hands, feet, arms, e.g.) and determine functional detection of physiological parameters (heart rate, breath, e.g.) through non-invasive optical imaging of transmitted light. Symmetry of optical beam shape is essential to avoid distortions and aberrations, and VCSEL 10 can design beam shape according to the optical apparatus in use.

3D Sensing

In one embodiment, VCSEL 10 is used in a three-dimensional (3D) sensing system. 3D sensing can be used as a process of obtaining data for features such as depth, length, width, for objects, human body, or other machines. This information can feed support to daily activities based on artificial intelligence. 3D sensing technology combines the scientific principles behind light reflection, geometry, and infrared photography with advanced computing power and artificial intelligence to mimic, supplant, or expand human visual capabilities.

3D sensing applications include gesture and facial recognition. Using 3D sensing, virtual reality (VR) or augmented reality (AR) can combine real-world 3D images with computer-generated projections to create or supplement visual experiences in unique and valuable ways. Transportation, industrial, and medical processes also benefit from the safety and efficiency gained through advanced world facing 3D sensing technology.

As a non-limiting example, illumination sources VCSEL 10 is used as an illumination source Eye safety is maintained through optics that suppress all zero-order light. Advanced engineered diffusers are capable of homogenizing input beams while shaping the output intensity profile, making them an essential ingredient for both Structured Light and ToF sensing applications.

Controlling optics, including narrow-bandpass filters with high signal-to-noise ratios, can be included to prevent extraneous light from reaching the sensor. This precise filtering improves system accuracy and reduces the processing burden.

VCSEL 10 in its tunable version brings several advantages when dealing with narrow bandpass filters, such as precise centering of emission wavelength, or continuous scan within a determined range.

Additional components can include depth cameras and firmware that complete the transformation of reflected light waves into meaningful 3D data sets. Cameras equipped with 3D sensors capable of rapid scanning and cloud point acquisition rates convert light source inputs into electrical energy. Customized firmware is then used to produce the digital code which can be deciphered by a myriad of cutting-edge applications. 3D sensing firmware can be upgraded as algorithms and functions continue to evolve.

VCSEL 10 and its beam shaping capability can bring superior performance by matching design of output beam to the optical apparatus in use.

In one embodiment, VCSEL 10 can be used as polarization stable optical source for 3D rotation sensing. VCSEL 10 is coupled to a polarization maintaining fiber in a fiber optic gyro (FOG) apparatus. VCSEL 10 operates under continuous tuning and FOG can have reduced overall drift and noise when compared do super luminescent diodes. Kerr-induced drift and backscattering interference can be reduced to almost zero, and FOG can operate with a much simpler driver electronics.

Scanning for Airborne Particles

In one embodiment, a scanning system includes VCSEL 10 source and a MEMS-actuated micro-lens scanner.

In one embodiment, a sensitive fluid sensor includes and detects airborne species with VCSEL 10. The sensor is adjustable for detecting various absorption lines. VCSEL 10 in its tunable version is used for the adjustment. The detection apparatus of the sensor can incorporate a sample cell through which light from VCSEL passes through. One or more detectors, including but not limited to a photo detector, and a processor can be included.

In one embodiment, a laser radar system for scanning airborne particles includes VCSEL 10. As a non-limiting example, a processor accesses optical budget stored in memory. The optical budget is associated the system in s predetermined amount of time and receive the information of the platform condition of instruction the system based on the information received and pass-through selection and at least two associated parameter values in sweep speed, scan pattern, scanning angle, spatial light distribution and time light distribution.

Optical Interconnects

In one embodiment, VCSEL 10 is used for applications in optical interconnects. As a non-limiting example, VCSEL 10 is integrated with a driver IC in a transmitter module.

As a non-limiting example, a transmitter includes a heterojunction bipolar transistor (HBT) integrated vertically to VCSEL 10, whereas the receiver is a heterojunction photo transistor (HPT).

Output signals from the logic devices are connected to corresponding HBTs and then amplified to drive VCSELs above threshold and into lasing, as well as to modulate the information from the output signals onto the emitted radiation. The optical radiation which emerges perpendicular to the plane of the substrate is transmitted vertically to the next adjacent optoelectronic integrated circuit (OEIC) module. The amplified signal is routed by metallic interconnections to electronic circuitry for further electronic processing. Such transmission and reception between OEIC modules establish communication paths or interconnections between adjacent OEIC modules.

In one embodiment, VCSEL 10 is integrated with transistors and high-density electronic logic to form three-dimensionally interconnectable optoelectronic integrated circuit (OEIC) modules. On or more OEIC modules include VCSEL 10. Communication between OEIC modules can be achieved by the free space propagation of laser radiation between one or more VCSEL 10 and corresponding receivers on adjacent OEIC modules.

In one embodiment a transistor, such as a heterojunction bipolar transistor (HBT) or field effect transistor (FET), is integrated with VCSEL 10.

Lidar System

In one embodiment, VCSEL structure 10 is included in a Lidar system. As a non-limiting example, Lidar is "light detection and ranging" or "laser imaging, detection, and ranging". VCSELs are inherently attractive for LIDAR systems in function of its small size when compared to other semiconductor lasers, possibility of monolithic manufacturing of arrays, and good reliability and performance.

In one embodiment, the following elements are included: VCSEL 10 apparatus as the source of the energy for the light pulses; a scanner and optics; one or more processors; timing electronics; and one or more inertial measurement units and GPS.

VCSEL 10 and its beam shaping capability can bring superior performance by matching design of output beam to the optical apparatus in use and perform with very low beam divergence.

VCSEL 10 has very stable linear polarization and is very advantageous for LIDAR sensing and identification of scattering through the transmitted medium. Use of polarized sources in LIDARs allow for identification of particle shape and, as an example, differentiation of water droplets from ice crystals. Moreover, symmetric optical beam shape is essential for quantifying local spatial variance and VCSEL 10 can design beam shape according to the optical apparatus in use.

In one embodiment, VCSEL 10 is manufactured in arrays for high power LIDAR applications.

Spectroscopy

As a non-limiting example, VCSEL 10 can be used for one or more of the following: quantitative measurement of species concentration; number density, or column density over an extensive range using optical spectroscopy and a sample region of fixed optical path length. The measured species can be a solid, liquid, or gas. In one embodiment, two or more spectroscopic methods are used to cover the full measurement dynamic range.

In one embodiment, a first spectroscopic method is selected for high sensitivity quantitative absorbance measurements for sample absorbances that can be smaller than 10'. In another embodiment, method is provided that spans sample absorbances that can exceed ~4. In another embodiment, methods are used to cover an intermediate absorbance range between those covered by the first and second methods.

In a second spectroscopic method, selection and corresponding control of the spectroscopic light source and processing of the detector output can be performed by a computer specifically programmed for these tasks. The computer executes instructions that can include selection points which determine when to switch between methods. Hysteresis in switching points prevents oscillation between methods as sample absorbances cross a transition point. This can provide a single, fixed sample optical path and all spectroscopic methods measure the same absorption feature.

Non-limiting examples of the first spectroscopic methods include but are not limited to: wavelength modulation spectroscopy; frequency modulation spectroscopy; two-tone frequency modulation spectroscopy; noise canceller methods; cavity ringdown spectroscopy; and rapid-scan direct absorption spectroscopy.

The second spectroscopic method, used for optically thick samples, determines the sample absorbance from a measurement of a width of the absorption spectrum. The width is the optical transmission at a wavelength having a selected difference from the wavelength of the center of the absorption feature.

A third spectroscopic methods include but are not limited to direct optical absorbance spectroscopy. Useful spectroscopic light sources include but are not limited to lasers such as wavelength tunable lasers such as diode lasers (including external cavity diode lasers), dye lasers, and optically pumped solid-state lasers (including diode pumped Solid state lasers); light Sources obtained using non-linear optical methods such as difference frequency generation, Sum frequency generation, harmonic generation, and optical parametric oscillation; broad band light sources such as lamps, light emitting diodes and thermal emitters in combination with wavelength selection optics Such as gratings, prisms, and interferometric devices.

In one embodiment, the spectrometer detector is a device that converts in a well-defined manner light beam intensity to a Voltage or current, and has a response time Suitable for all spectroscopic methods used by the spectrometer. Suitable detectors include but are not limited to photodiodes and photomultipliers.

Output from each InGaAs detector is demodulated using phase-sensitive demodulation electronics located on the microcomputer board. The resulting demodulated signals are acquired by the microcomputer using analog-to-digital converters, with the data acquisition synchronized with changes in the laser wavelength Sweep current. This sequence generates wavelength modulation spectra of the sample and the reference. Wavelength modulation spectroscopy is used for sample absorbances less than 0.01.

The absorbance due to gas in the sample cell and, therefore, the gas concentration in the sample, is computed by the microcomputer using the amplitudes of the sample wavelength modulation spectrum. The con centration is also compared with set points for Switching among the spectroscopic methods. The second method is measurement of the optical transmission at a selected wavelength displaced from the center of the gas absorption peak. In one embodiment, an observed transmission is compared with values obtained by calibration or calculation to determine the gas concentration. Implementing the second method includes turning off the laser current modulation and digitizing the InGaAs photodiode outputs directly without using the demodulation electronics.

The selected wavelength used for the transmission measurement need not be specified absolutely. It can be determined using a direct absorption spectrum having an absorbance of about 2. The width of that spectrum is used to determine the wavelength scan rate of the laser with changing current, and the selected wavelength for the second method measurements is computed as a fixed multiple of the direct absorption spectrum width. In the preferred embodiment, the third method is direct absorption spectroscopy, and is used for sample absorbances between 0.1 and 0.3.

The laser modulation is switched off, and the InGaAs photodiode outputs are digitized directly by the microcomputer. The peak absorbance is calculated by converting by applying Beer's Law to the optical transmission spectrum obtained by scanning the diode laser wave length across the gas absorption line. Spectra of the reference gas are used to maintain the gas absorption peak at or close to the center of the laser wavelength scan range. For the first spectroscopic method, the wavelength modulation spectrum, obtained by demodulating the detector output at twice the modulation frequency, has an extremum at the gas peak center.

The microcomputer program compares the position of that extremum with the desired peak position, and adjusts the laser temperature to shift the laser wavelength scan range accordingly. Odd harmonic detection (e.g., if 3f . . . ) of the reference spectra results in Zero crossings at the line center that can also be used to locate the peak position. For the second and third methods, the peak of the direct absorption spectrum of the reference gas provides the wavelength set point.

All spectra are normalized to unity peak signal. The changes in peak width are readily apparent. In the preferred embodiment, the device is calibrated for optically thick samples by first filling the multiple pass cell with pure (100%) gas, and locating the wave length or optical frequency displacement from the line center (as indicated by the spectrum of the reference gas) where the observed transmission is 10%.

Next, the transmission at that selected wavelength or optical frequency is measured for a series of calibration gas mixtures exhibiting transmission between about 90% and 10%. The vertical dotted line in FIG. 5 identifies the selected wavelength and the filled circles are the observed transmissions for the corresponding calibration gases. The resulting data (transmission at selected wave length vs. concentrations) are fit to a second order polynomial 100, see FIG. 6. Parameterization of the data set enables rapid computation of sample concentration from a measurement of transmission at the selected wavelength.

Temperature and pressure effects are dominated by changes in the gas number density within the optical cell, and can be corrected using the ideal gas law. Pressure changes also produce Subtle effects on absorption line widths, and are corrected by calibration. Typical update rates are 1 Hz. A second embodiment of the invention is an airborne hygrometer for measuring water vapor concentrations in the atmosphere at altitudes ranging from about sea level to the upper troposphere.

Water vapor concentrations vary by about six orders of magnitude, from 5.6% down to about 1.5 parts per billion over this range of conditions. Corresponding dew/frost points range from +35 to −110 EC. This embodiment uses a multiple pass cell that is open to the atmosphere and provides a sample path length of about 4 m. The wavelength tunable light Source is a vertical cavity Surface emitting diode laser operating at a wavelength near 1855 nm.

There is sufficient sample path signal to use for laser wavelength stabilization. Additional embodiments include modifying the hygrometer for less extreme conditions by substituting a diode laser operating near 1394 nm or 942 nm for the 1855 nm device. Advantages of these changes include lower costs for the shorter wavelength lasers and their corresponding photo diode detectors.

Fiber Bragg Interrogator Sensing Systems

A fiber Bragg grating (FBG) is an optical fiber in which the core refractive index is modulated along the direction of propagation of light. The modulation of the refractive index causes an FBG to act like an optical mirror reflecting certain wavelengths (Bragg wavelength). Strain and temperature change the Bragg wavelength of the FBG, i.e., other wavelengths are reflected and the amount of stress and temperature change can be determined.

By adding several Bragg gratings along a fiber, a monitoring system can be established. VCSEL 10 can be used for these systems since a single emitter can cover multiple FBGs on the same fiber.

Gas Sensing by Tunable Diode Laser Absorption Spectroscopy (TDLAS)

Light from a wavelength tunable laser is transmitted through a gas cell containing the target gas. By tuning the wavelength to a gas absorption line and measuring the absorption, the gas concentration can be determined. VCSEL 10 can be tuned to adsorption lines of different gasses allowing gas sensing systems where a single laser is used for the detection of multiple gases.

Integration with Photonic Integrated Circuits

Most photonics integrated circuits require an external light source. For most flexibility a wavelength tunable light source, which can be mounted on the photonic integrated circuit is desired. The top or bottom of VCSEL 10 is a small tunable light source and an ideal candidate for this heterogeneous integration.

As a non-limiting example, a photonic integrated circuit is a device that includes multiple (at least two) photonic functions and as such is similar to electronic integrated circuit. As a non-limiting example, the photonic integrated circuit can provide functions for information signals impressed on optical wavelengths. Suitable wavelengths include but are not limited to the visible spectrum or near infrared 850 nm-1650 nm.

As a non-limiting example, VCSEL 10 integrated with a photonic integrated circuit can be used in fiber-optic communication through applications in other fields.

As a non-limiting example VCSEL 10 can be integrated with a photonic circuit including but not limited to: electro-optics; acousto-optic; nonlinear optics; optoelectronics, and the like.

In one embodiment, VCSEL 10 is integrated with other photonic components on a common planar substrate. As a non-limiting example, these components can include one or more of: beam splitters; gratings; couplers; polarizers; interferometers; sources; detectors and the like. In one embodiment, these can be used for different applications, including but not limited to: optical communication systems; CATV; instrumentation; sensors and the like.

Method of VCSEL Formation

In one embodiment, a regular VCSEL apparatus 10 includes current injection via the one or more BTJs 28, TJ's 20, planar structures and/or additional BTJ's without ion implantation.

As a non-limiting example, VCSEL apparatus 10 includes one or more BTJ's 28 and is tunable. In one embodiment, formation of the one or more BTJ's 28 TJ's 20, planar structures and/or additional BTJ's, requires an etch of a TJ aperture and regrowth of a top semiconductor epitaxial structure. As a non-limiting example, the process results on a non-flat surface, not suitable for an HCG 34. Moreover, uneven surface and regrowth process causes additional strain which also prevents MEMS manufacturing. In one embodiment, this requires relaxation of epitaxial growth through careful design of regrowth and MEMS actuation on the non-planar surface.

In one embodiment, VCSEL 10 formation includes the steps of:
(i) growing a semiconductor active cavity material consisting of a multi-quantum well layer stack sandwiched between bottom and top spacer regions, the top spacer region terminating with a p-layer and a p++/n++ tunnel junction grown on top of the p-layer, each of the p++- and p-layer presenting a p-type layer;
(ii) etching the active cavity material formed in step (i) to form a top of a selected geometric structure such as a mesa, including at least the upper n++ layer of the tunnel junction emerging from the underlying p-type layer, thereby creating a structured surface of the active cavity material formed by the upper surface of the mesa and the upper surface of the p-type layer outside a top of a selected structure such as a mesa;
(iii) applying a wafer fusion between the structured surface of the active cavity material and a substantially planar surface of a n-type semiconductor layer of a first distributed Bragg reflector (DBR) stack, thereby causing deformation of the fused surface around a top of a selected structure such as a mesa, and defining an electrical confinement aperture 30 for electrical current flow therethrough, the electrical confinement aperture 30 including a top of a selected structure such as a mesa, surrounded by an air gap between the deformed fused surfaces and defining an active region 14 of the device;
(iv) forming a second DBR stack on the surface of the active cavity material opposite to the structured surface;
(v) forming ohmic contacts on the VCSEL device structure to enable the electrical current flow through the electrical confinement aperture 30 to the active region 14.

In one embodiment, VCSEL apparatus 10 is made with the following processes: epitaxial growth of VCSEL up to tunnel junction (TJ) layer 20; development of TJ etches; identify etchants compatible to the TJ design 20; and development of regrowth process.

Surface compatibility to regrowth—not all surfaces or all materials are suitable for seeding the regrowth process—there is a trade off in between the best design for the TJ 20 and a design good enough which is suitable for regrowth.

Regrowth has to be carried long enough in order to planarize the surface where HCG 34 is manufactured on one or more of: VCSEL regular processing; growth of bottom VCSEL and then: etch of TJ 20, leaving some p++—target is 5-10 nm and regrowth of top VCSEL from etched seed layer.

Then there is: a regrowth of n-InP with grading; a regrowth of top DBR 42 (if included in design), sacrificial layer and HCG 34; followed by standard VCSEL manufacturing.

Lidar for Mobile Devices

Lidar works by sending out laser light and measuring how long it takes to bounce back. Because light travels at a constant speed, the round-trip time can be translated into a precise distance estimate. Repeat this process across a two-dimensional grid and the result is a three-dimensional "point cloud" showing the location of objects around a room, street, or other location. The combination of VCSELs and SPADs enables a dramatic simplification of conventional lidar designs. A three-dimensional lidar mounted individually packaged lasers in a column on a spinning gimbal. Each laser had a matching detector.

Recent iPhones already had another 3-D sensor called a camera that enabled Apple's Face ID feature. It also used an array of VCSELs reportedly provided.

The VCSEL of the present invention can be used with SPADs.

It is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:
1. A light emitting device, comprising:
a first mirror;
one or more active regions with a first active region adjacent to the first mirror, each of an active region including quantum wells and barriers, each of an active region surrounded by one or more p-n junctions, the one or more active regions including a selected shape structure each with a tunnel junction (TJ);
one or more apertures provided with the selected shape structure;
one or more buried tunnel junctions (BTJ), additional TJ's, planar structures and/or additional BTJ's are created during a regrowth process that is independent of a first growth process of the first mirror, the active region and the one or more TJs;
one or more electrical confinement apertures defined by the one or more BTJ's, additional TJ's, planar structures and/or additional BTJ;

a vertical resonator cavity disposed over the electrical confinement aperture;

a high contrast grating (HCG) operating as a second mirror positioned over the vertical resonator cavity, the HCG configured to reflect a first portion of light back into the vertical resonator cavity, and a second portion of the light as an output beam from the VCSEL, the HCG structure being layered on the selected shape structure; and wherein a shape of the output beam of the light emitting device is determined by a geometric shape of the one or more BTJ apertures, apertures for additional TJ's, planar structures and/or additional BTJ's, with a transmission function of the HCG and is designed according to the desired optical transmission function of the application.

2. The light emitting device of claim 1, wherein the light emitting device is a VCSEL.

3. The VCSEL of claim 2, wherein, a geometry of the aperture is designed to be slightly elliptical to compensate the beam inside the VCSEL such that the device provides a desirable beam shape as an output beam from the HCG for the application.

4. The VCSEL of claim 2, wherein a coupling loss of the output beam to an optical fiber or optical system is reduced by selection of the proper BTJ aperture geometry, aperture geometries of the one or more buried tunnel junctions (BTJ), additional TJ's, planar structures and/or additional BTJ's and HCG transmission characteristics.

5. The VCSEL of claim 4, wherein the HCG controls an output beam polarization and single longitudinal wavelength.

6. The VCSEL of claim 2, wherein a top DBR is included in the structure between the HCG and buried tunnel junction.

7. The VCSEL of claim 2, where an external mirror in addition to the HCG is used to further shape the output beam.

8. The VCSEL of claim 2, wherein the sacrificial layer of semiconductor material is removed via etching at specific locations in order to release the top mirror tuning structure.

9. The VCSEL of claim 8, wherein when the VCSEL is tunable and the periodic structure is released in order to change an optical length of an optical cavity via an external input that causes movement of the periodic structure.

10. The VCSEL of claim 2, wherein the top DBR is processed to become a periodic structure configured to resonate and work as a mirror at specific wavelengths.

11. The VCSEL of claim 10, wherein tuning is achieved via an external input based on thermal, electrostatic or piezoelectric excitation to move HCG 4.

12. The VCSEL of claim 10, wherein tunability can be achieved by heating the VCSEL directly or changing its driving current.

13. The VCSEL of claim 10 wherein the VCSEL is at least one of: an air-cavity-dominant (ACD) or a semiconductor-cavity-dominant (SCD) design.

14. A method of creating a light emitting device, comprising:

forming during a first growth process a first mirror, an active region, at least one tunnel junction (TJ), an aperture with a selected shape structure formed by etching and including at least one TJ, forming a buried tunnel junction (BTJ), one or more TJ's planar structure and/or one or more BTJ's during a regrowth process that is independent of the first growth process of the first mirror, the active region and the TJ;

forming a high contract grating (HCG) operating as a second mirror positioned over the vertical resonator cavity, the HCG configured to reflect a first portion of light back into the vertical resonator cavity, and a second portion of the light as an output beam from the VCSEL, the HCG structure being layered on the selected shape structure wherein a shape of the output beam of the light emitting device is determined by a geometric shape of the one or more BTJ apertures and transmission function of the HCG; and creating a shape of the output beam of the light emitting device by determining geometric shape of the one or more BTJ apertures, apertures for additional TJ's, planar structures and/or additional BTJ's, with a transmission function of the HCG and is designed according to the desired optical transmission function of the application.

15. The method of claim 14, wherein a geometry of the selected shape structure is determined in response to a far field optical transmission function for a desired application.

16. The method of claim 14, wherein the desired selected is selected from one or more of: communications; optical coherence tomography, medical tissue imaging, 3D sensing, scanning for air borne particles, optical interconnects, lidar, spectroscopy, fiber Bragg integrated sensing; gas sensors; and integration with photonics.

17. The method of claim 14, wherein the light emitting structure is a VCSEL.

* * * * *